(12) United States Patent
Lin

(10) Patent No.: US 7,547,924 B1
(45) Date of Patent: Jun. 16, 2009

(54) LIGHT-EMITTING DIODE STRUCTURE

(76) Inventor: Chien-Feng Lin, No. 14, Lane 9, Ankang Street, Hsinchu City (TW)

( * ) Notice: Subject to any disclaimer, the term of this patent is extended or adjusted under 35 U.S.C. 154(b) by 54 days.

(21) Appl. No.: 11/968,038

(22) Filed: Dec. 31, 2007

(51) Int. Cl.
*H01L 33/00* (2006.01)
(52) U.S. Cl. .......................................... 257/99; 257/98
(58) Field of Classification Search ................... 257/98, 257/99
See application file for complete search history.

(56) References Cited

U.S. PATENT DOCUMENTS

2006/0054914 A1* 3/2006 Hsian Yi ..................... 257/100
2008/0149960 A1* 6/2008 Amo et al. .................... 257/98

* cited by examiner

*Primary Examiner*—Wai-Sing Louie
*Assistant Examiner*—Bilkis Jahan
(74) *Attorney, Agent, or Firm*—WPAT, P.C.; Anthony King

(57) ABSTRACT

An LED structure includes a first conductive body, a first insulating body on the first conductive body, a second conductive body on the first insulating body, and an LED. The first conductive body has a conducting portion upward projected from the insulating body and the second conductive body, so that a conducting section at a top of the conducting portion is exposed at the insulating sleeve portion. The LED is mounted on the conducting section of the first conductive body and electrically connected to the second conductive body. With these arrangements, the LED structure may be mounted on a power supply board without the need of distinguishing the polarities of electrodes, and can therefore be easily mounted to and dismounted from the power supply board and be conveniently replaced when necessary.

15 Claims, 15 Drawing Sheets

LIGHT-EMITTING DIODE STRUCTURE

FIELD OF THE INVENTION

The present invention relates to a light-emitting diode (LED) structure, and more particularly to an LED structure that could be easily mounted to and dismounted from a power supply board and therefore be conveniently replaced when necessary.

BACKGROUND OF THE INVENTION

A light-emitting diode (LED) has the advantages of having simple structure and providing high brightness, and is therefore widely employed in advertising and illuminating facilities, such as large-scaled outdoor TV walls, large-scaled outdoor signboards, car lights, flashlights, etc. Conventionally, the LED has a longer and a shorter pin, and the two pins have different polarities. To mount the conventional LED to a power supply board, a user has to check whether two insertion holes on the power supply board for receiving the two pins of the LED respectively have a polarity the same as that of the pin to be received therein. If not, the user has to turn the LED for the pins thereof to separately align with an insertion hole having a matched polarity, so that the LED may be correctly mounted on the power supply board. Therefore, the mounting of the conventional LED to a power supply board is troublesome and inconvenient. Similarly, it is uneasy to dismount or replace the conventional LED when the same is failed.

It is therefore tried by the inventor to develop an LED structure that could be very easily mounted to and dismounted from a power supply board, and accordingly, be conveniently replaced when necessary.

SUMMARY OF THE INVENTION

A primary object of the present invention is to provide an improved LED structure that can be easily mounted on and dismounted from a power supply board, and can therefore be conveniently replaced when necessary.

To achieve the above and other objects, the LED structure of the present invention includes a first conductive body having an upward projected conducting portion; a first insulating body having an insulating sleeve portion and being disposed on the first conductive body with the insulating sleeve portion fitted around the conducting portion, such that a conducting section at a top of the conducting portion is exposed at the insulating sleeve portion; a second conductive body having a through opening and being disposed on the first insulating body with the insulating sleeve portion upward extended through the opening to electrically isolate the second conductive body from the first conductive body; and an LED having at least one first electrode in electric contact with the conducting section of the first conductive body and at least one second electrode in electric contact with the second conductive body.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
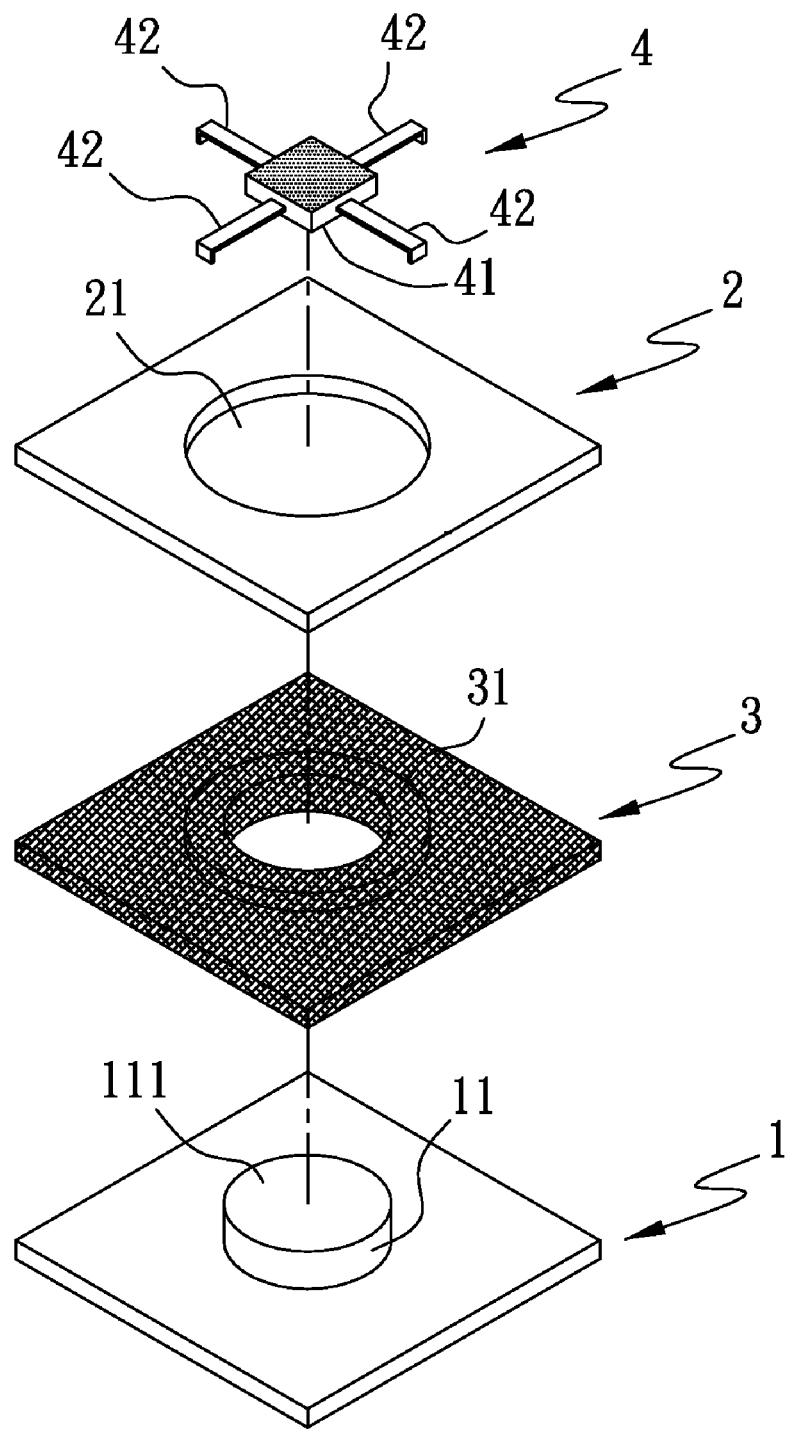
FIG. 1 is an exploded perspective view of an LED structure according to a first preferred embodiment of the present invention.
Figure 2:
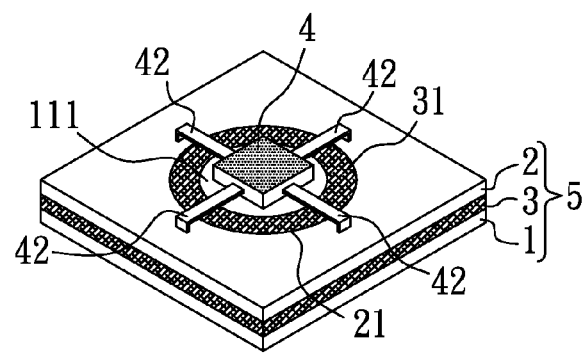
FIG. 2 is an assembled view of FIG. 1.

Please refer to FIGS. 1 and 2 that are exploded and assembled perspective views, respectively, of an LED structure according to a first preferred embodiment of the present invention. As shown, in the first preferred embodiment, the LED structure includes a first conductive body 1, a second conductive body 2, a first insulating body 3, and an LED 4.

The first conductive body 1 includes an upward projected conducting portion 11, which may be a cylindrical post.

The first insulating body 3 includes an insulating sleeve portion 31, which may be a hollow boss, such that the first insulating body 3 may be disposed on the first conductive body 1 with the insulating sleeve portion 31 fitted around the upward projected conducting portion 11. It is noted a conducting section 111 at a top of the projected conducting portion 11 is exposed at the sleeve portion 31.

The second conductive body 2 includes a through opening 21 and is disposed on the first insulating body 3, such that the hollow cylindrical insulating sleeve portion 31 of the first insulating body 3 is upward extended through the opening 21. Meanwhile, the second conductive body 2 is electrically isolated from the first conductive body 1 by the first insulating body 3.

The LED 4 is mounted on the conducting section 111, such that a first electrode 41 located at a lower side of the LED 4 is in electric contact with the conducting section 111 and four second electrodes 42 spaced at four sides of the LED 4 are electrically connected to the second conductive body 2. By increasing the number of the second electrodes 42, it is possible to increase the amount of conducted electric current.

Heat produced by the LED 4 during the operation thereof may also be radiated from the second electrodes 42 and dissipated into ambient environment.

Figure 3:
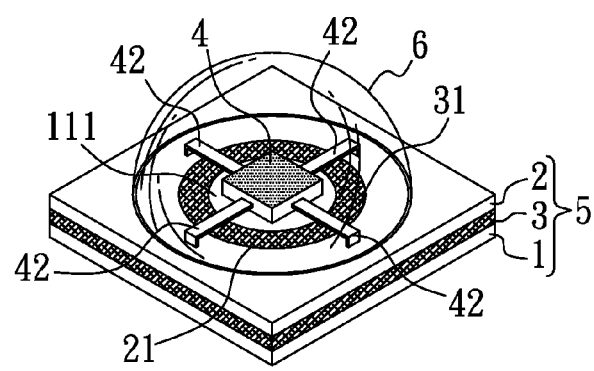
FIG. 3 is an assembled perspective view of an LED structure according to a second preferred embodiment of the present invention.
Figure 4:
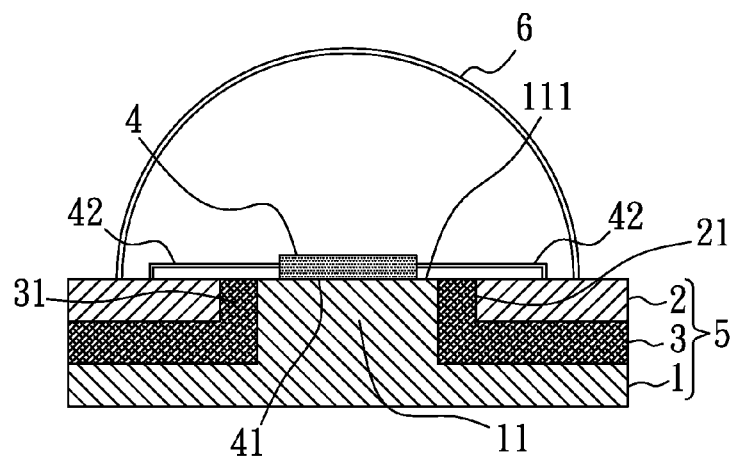
FIG. 4 is a vertical sectional view of FIG. 3.

Please refer to FIGS. 3 and 4, which are assembled perspective view and vertical sectional view, respectively, of an LED structure according to a second preferred embodiment of the present invention. The second embodiment is generally structural similar to the first embodiment, but further includes a light hood 6. The light hood 6 may be semispherical in shape for covering the LED 4, the first electrode 41, and the four second electrodes 42 therein, so as to shield the LED 4, the first electrode 41, and the four second electrodes 42 from destructive factors in the ambient environment. The light hood 6 also concentrates or diffuses the light emitted by the LED 4.

When the first insulating body 3 has been disposed on the first conductive body 1 and the second conductive body 2 is sequentially disposed on the first insulating body 3, a main body 5 is formed. In the illustrated preferred embodiments of the present invention, the main body 5 is in the shape of a square base.

Figure 5:
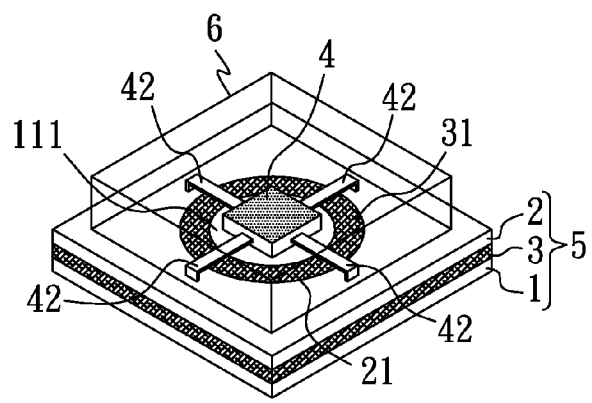
FIG. 5 is an assembled perspective view of an LED structure according to a third preferred embodiment of the present invention.

FIG. 5 is an assembled perspective view of an LED structure according to a third preferred embodiment of the present invention. The third embodiment is generally structural similar to the second embodiment, except that the light hood 6 in the third embodiment is rectangular in shape.

Figure 6:
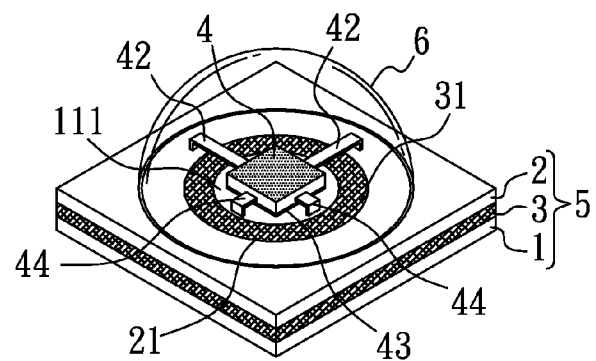
FIG. 6 is an assembled perspective view of an LED structure according to a fourth preferred embodiment of the present invention.
Figure 7:
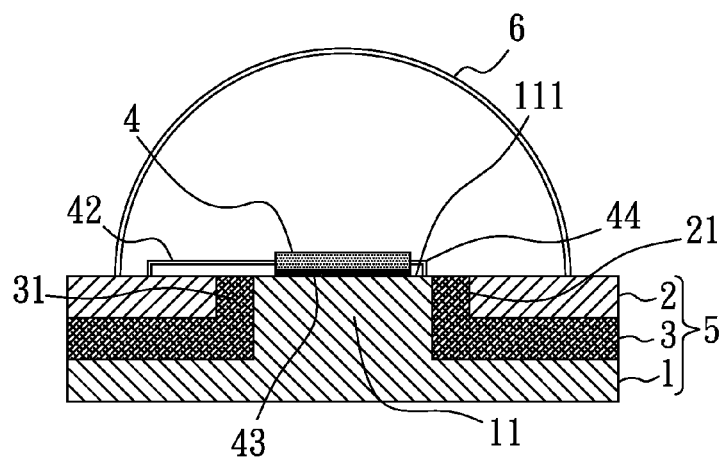
FIG. 7 is a vertical sectional view of FIG. 6.

FIGS. 6 and 7 are assembled perspective and vertical sectional views, respectively, of an LED structure according to a fourth preferred embodiment of the present invention. The fourth embodiment is generally structurally similar to the second embodiment, but further includes a second insulating body 43 disposed between the LED 4 and the conducting section 111, and has two first electrodes 44 electrically connected to the conducting section 111, and two second electrodes 42 located at two sides of the LED 4 and electrically connected to the second conductive body 2. By increasing the number of the first and the second electrodes 44, 42, it is possible to increase the amount of conducted electric current. Heat produced by the LED 4 during the operation thereof may also be radiated from the first and the second electrodes 44, 42 and dissipated into ambient environment.

Figure 8:
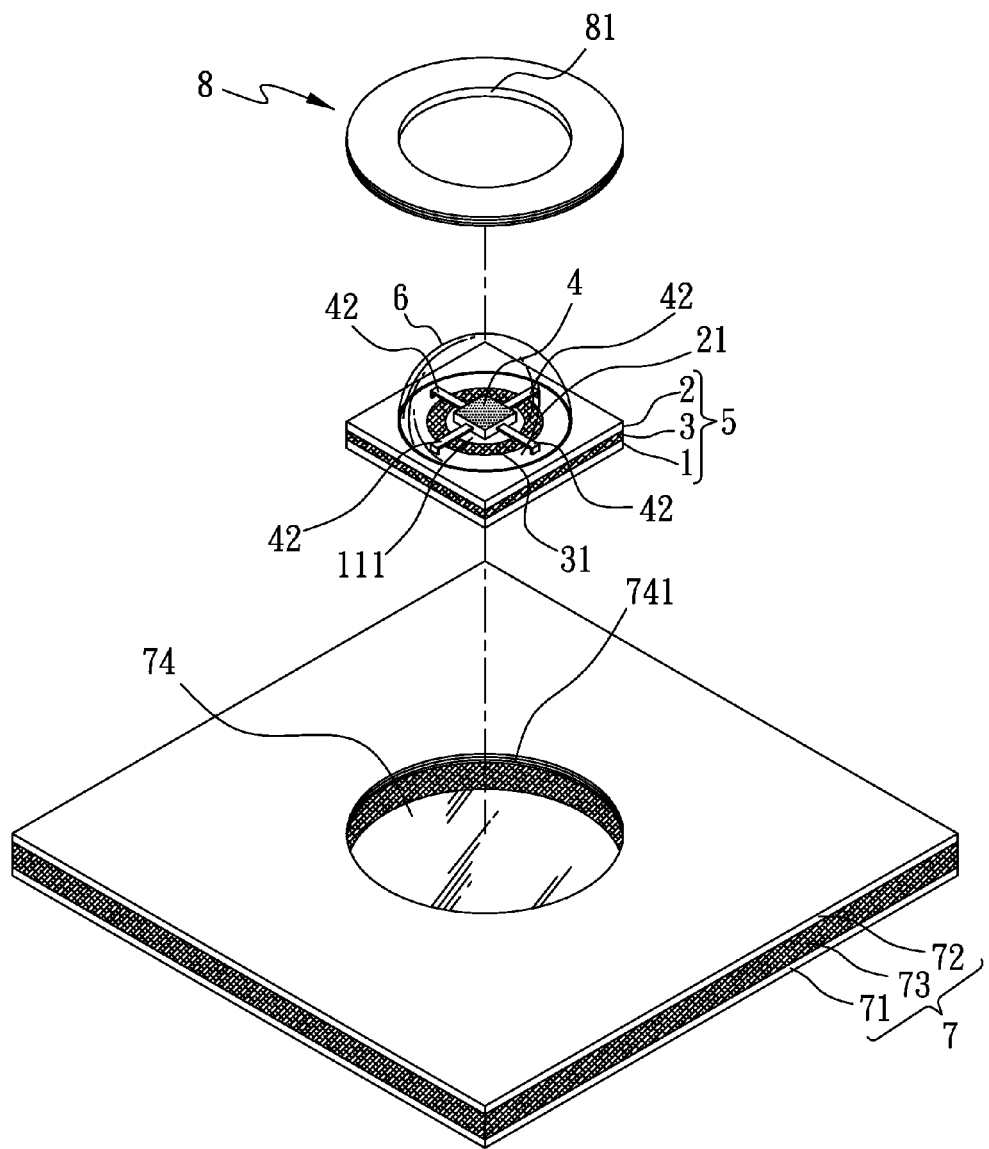
FIG. 8 is an exploded view of an LED structure according to a fifth preferred embodiment of the present invention.
Figure 9:
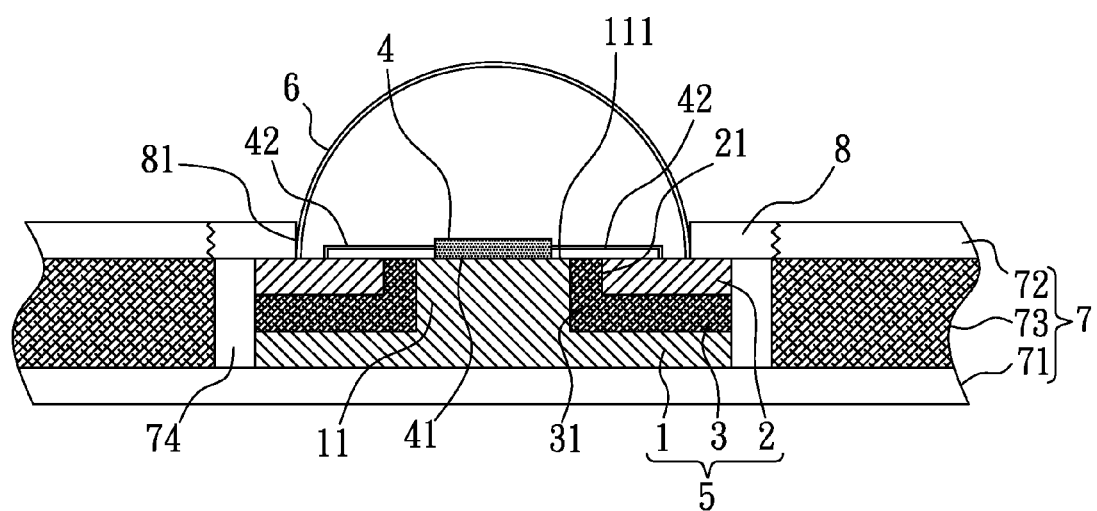
FIG. 9 is an assembled vertical sectional view of FIG. 8.

FIGS. 8 and 9 are exploded perspective view and assembled vertical sectional view, respectively, of an LED structure according to a fifth embodiment of the present invention. As shown, the LED structure of the fifth embodiment is a combination of the LED structure of the second embodiment and a power supply board 7. The power supply board 7 includes a first conducting layer 71, a second conducting layer 72, an insulating layer 73, and an upper conductive cover plate 8. The insulating layer 73 is located on the first conducting layer 71, and the second conducting layer 72 is located on the insulating layer 73. The upper conductive cover plate 8 is provided with a through opening 81, the second conducting layer 72 is provided with an upper opening 741, and the insulating layer 73 is provided with a receiving space 74. The LED structure of the second embodiment is mounted on the power supply board 7 in the receiving space 74 via the upper opening 741, such that the first conductive body 1 is in electric contact with the first conducting layer 71. The upper conductive cover plate 8 is then fastened to the upper opening 741, so that the second conductive body 2 is in electric contact with the upper conductive cover plate 8 and the light hood 6 is upward protruded from the through opening 81.

Figure 10:
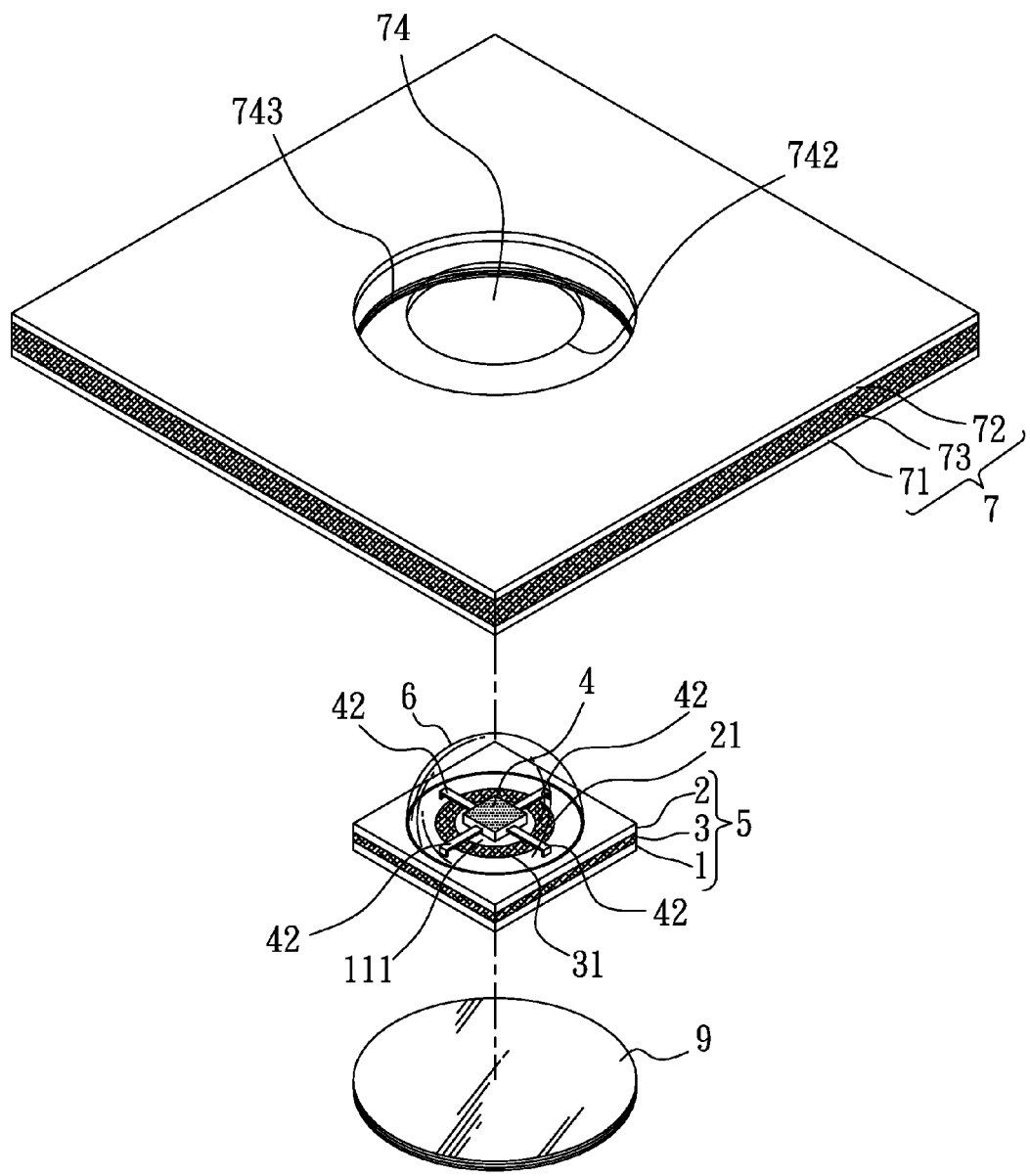
FIG. 10 is an exploded view of an LED structure according to a sixth preferred embodiment of the present invention.
Figure 11:
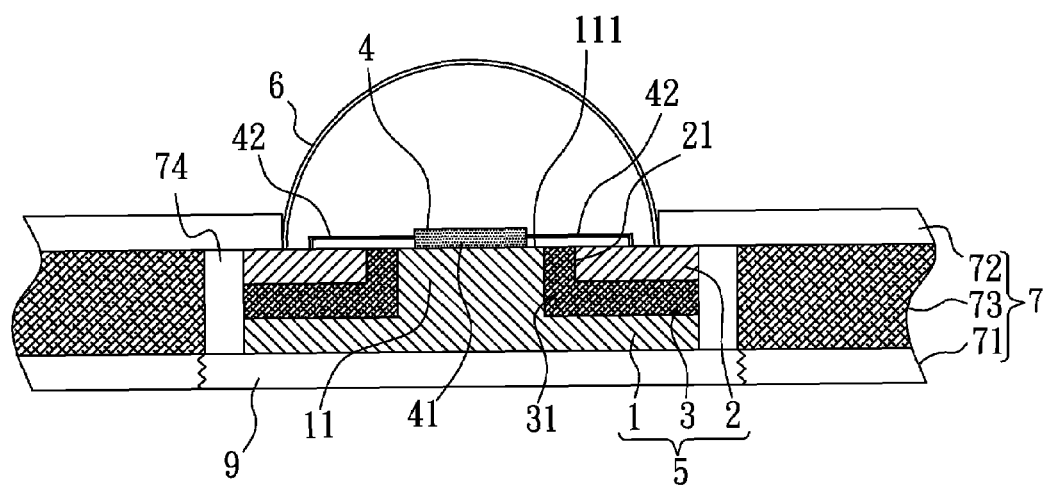
FIG. 11 is an assembled vertical sectional view of FIG. 10.

FIGS. 10 and 11 are exploded perspective view and assembled vertical sectional view, respectively, of an LED structure according to a sixth embodiment of the present invention. As shown, the LED structure of the sixth embodiment is a combination of the LED structure of the second embodiment and a power supply board 7. The power supply board 7 includes a first conducting layer 71, a second conducting layer 72, an insulating layer 73, and a lower conductive cover plate 9. The insulating layer 73 is located on the first conducting layer 71, and the second conducting layer 72 is located on the insulating layer 73. The first conducting layer 71 is provided with a lower opening 743, the second conducting layer 72 is provided with a through opening 742, and the insulating layer 73 is provided with a receiving space 74. The LED structure of the second embodiment is mounted on the power supply board 7 in the receiving space 74 via the lower opening 743, such that the light hood 6 is upward protruded from the through opening 742, and the second conductive body 2 is in electric contact with the second conducting layer 72. The lower conductive cover plate 9 is then fastened to the lower opening 743, so that the first conductive body 1 is in electric contact with the lower conductive cover plate 9.

Figure 12:
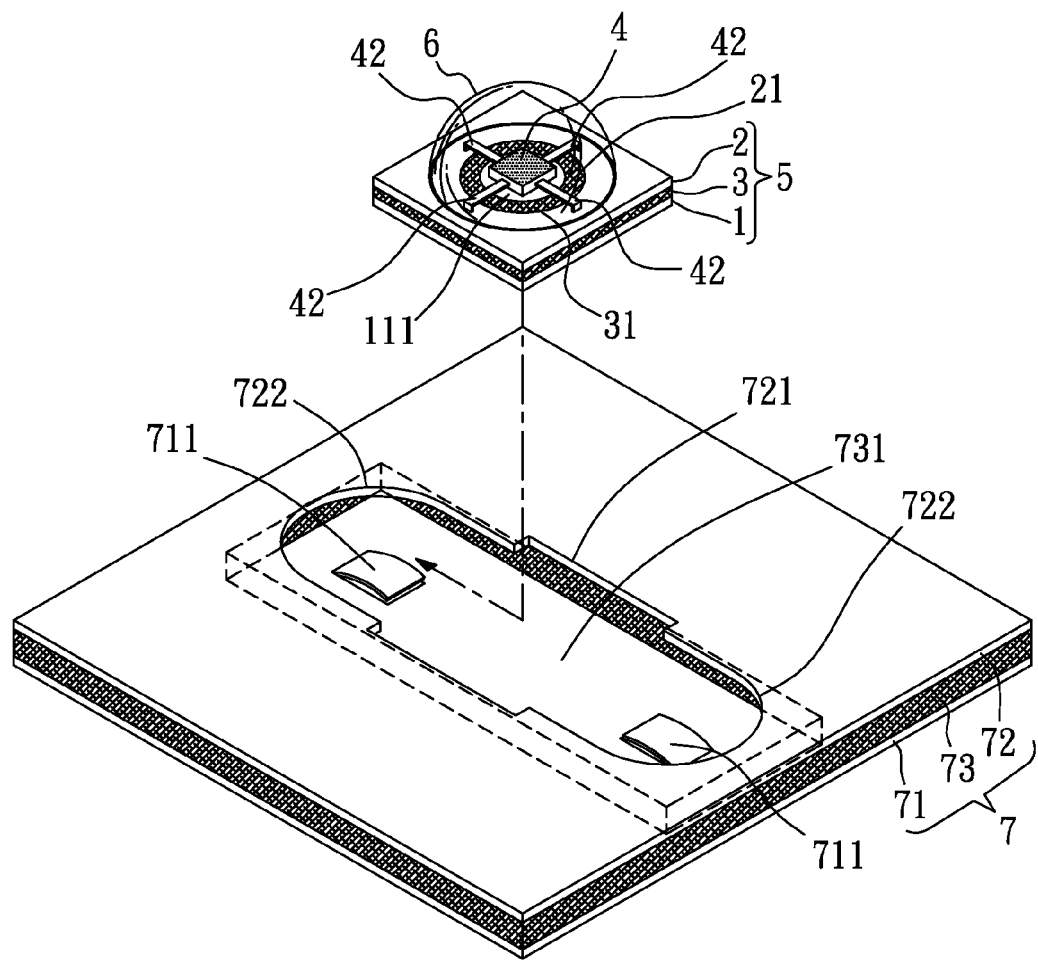
FIG. 12 is an exploded view of an LED structure according to a seventh preferred embodiment of the present invention.
Figure 13:
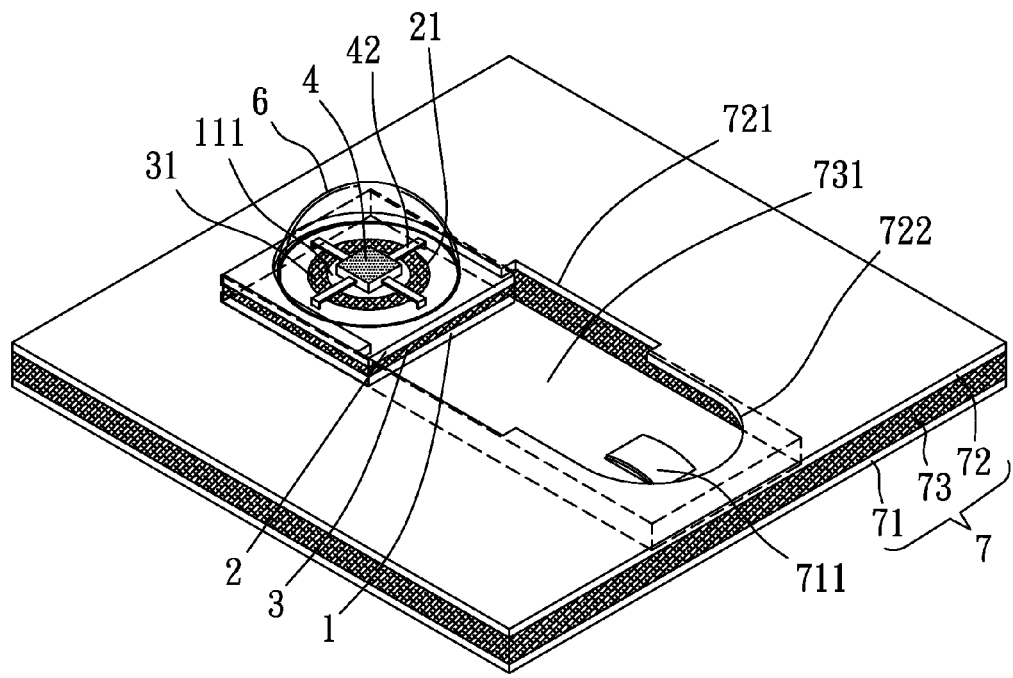
FIG. 13 is an assembled view of FIG. 12.
Figure 14:
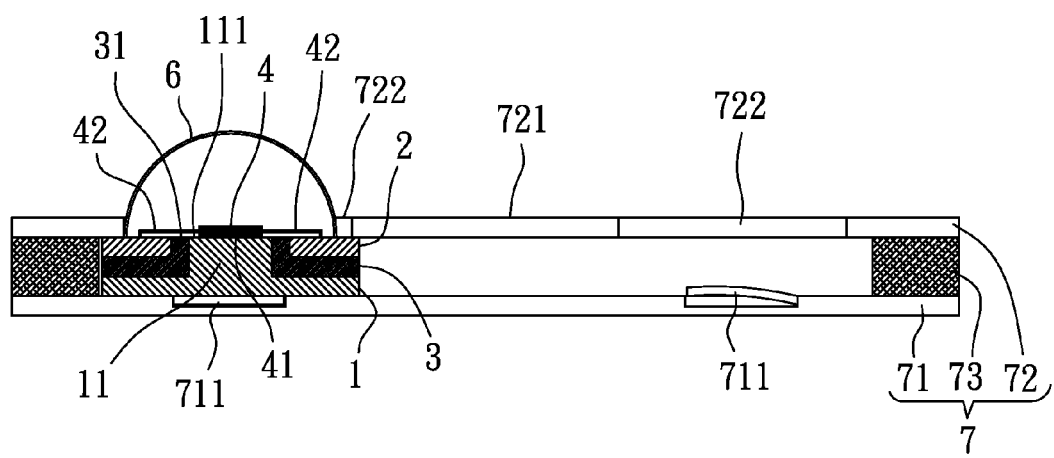
FIG. 14 is a vertical sectional view of FIG. 13.

FIGS. 12 to 14 are exploded perspective view, assembled perspective view, and assembled vertical sectional view, respectively, of an LED structure according to a seventh embodiment of the present invention. As shown, the LED structure of the seventh embodiment is a combination of the LED structure of the second embodiment and a power supply board 7. The power supply board 7 includes a first conducting layer 71, a second conducting layer 72, and an insulating layer 73. The insulating layer 73 is located on the first conducting layer 71, and the second conducting layer 72 is located on the insulating layer 73. The insulating layer 73 is provided with a receiving space 731, and the second conducting layer 72 is provided near a middle portion with a first opening 721 and at two opposite ends of the first opening 721 with two second openings 722, which have a width smaller than that of the first opening 721 and are communicable with the first opening 721. The LED structure of the second embodiment is mounted on the power supply boar 7 in the receiving space 731 via the first opening 721, and is then moved to one of the two second openings 722. With the reduced width of the second opening 722, the main body 5 of the LED structure of the second embodiment is held in the receiving space 731 below the second opening 722. At this position, the first conductive body 1 is in electric contact with the first conducting layer 71, the second conductive body 2 is in electric contact with the second conducting layer 72, and the light hood 6 is upward protruded from the second opening 722. A conducting spring leaf 711 is provided on the first conducting layer 71 in each of the second openings 722, such that when the main body 5 is received in the receiving space 731 below the second opening 722, the conducting spring leaf 711 is located between the first conductive body 1 and the first conducting layer 71 to ensure firm disposition of the LED structure of the second embodiment in the receiving space 731.

Figure 15:
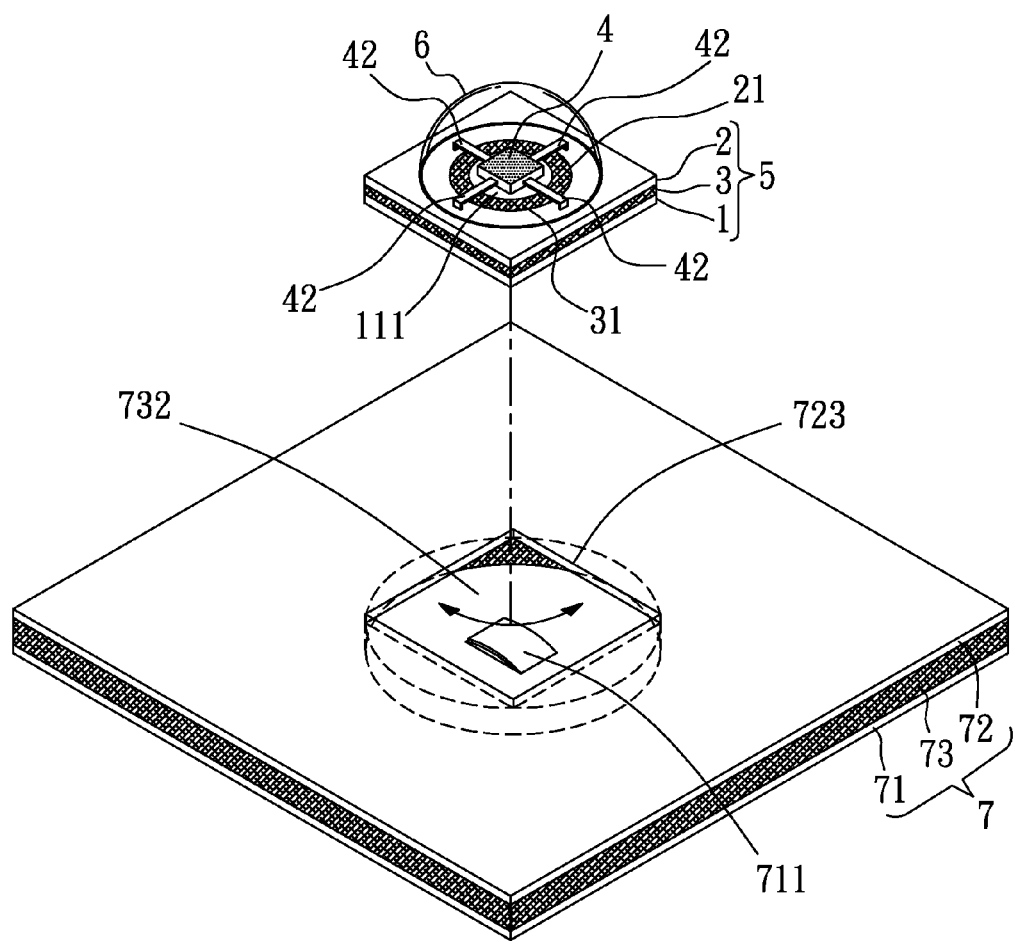
FIG. 15 is an exploded view of an LED structure according to an eighth preferred embodiment of the present invention.
Figure 16:
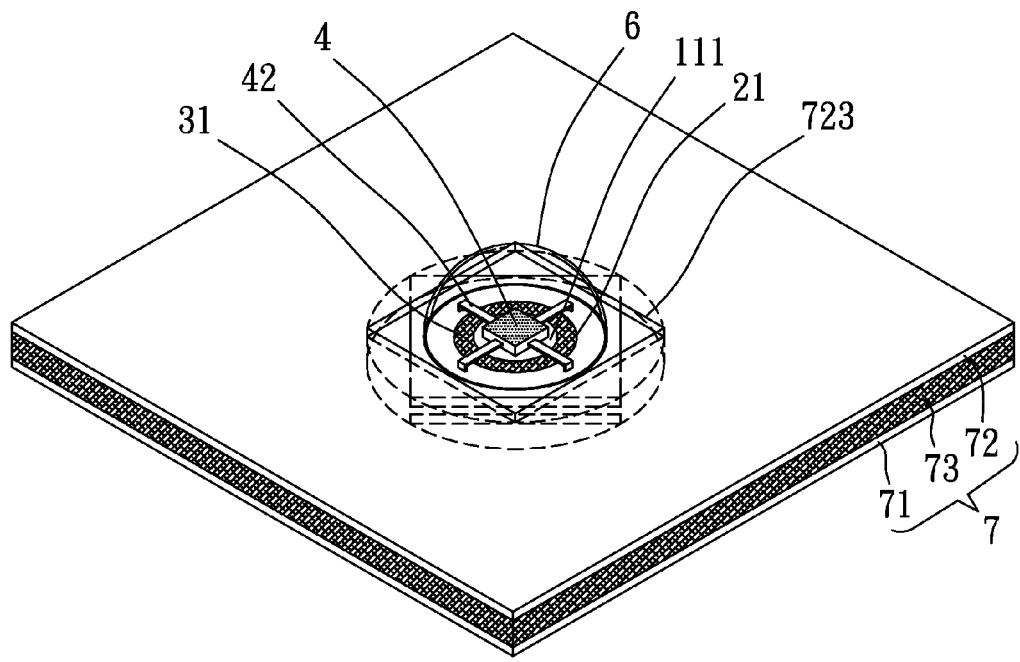
FIG. 16 is an assembled view of FIG. 15.
Figure 17:
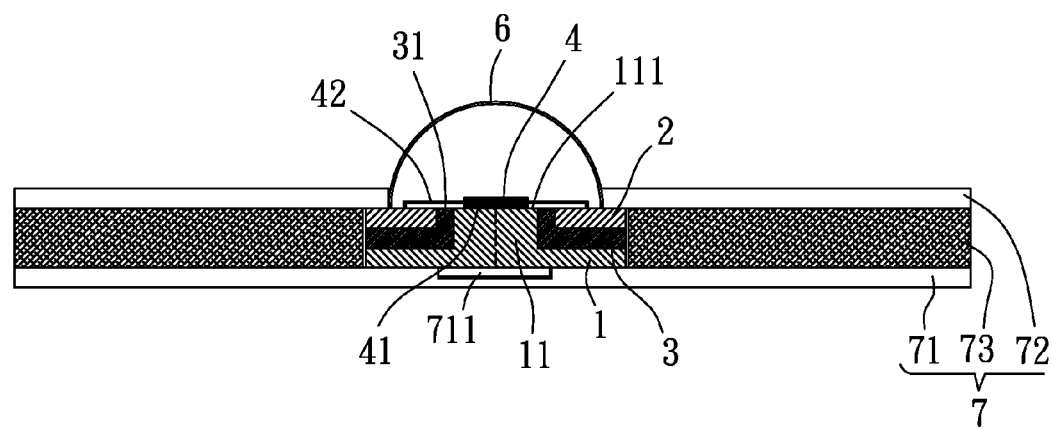
FIG. 17 is a vertical sectional view of FIG. 16.

FIGS. 15 to 17 are exploded perspective view, assembled perspective view, and assembled vertical sectional view, respectively, of an LED structure according to an eighth embodiment of the present invention. As shown, the LED structure of the eighth embodiment is a combination of the LED structure of the second embodiment and a power supply board 7. The power supply board 7 includes a first conducting layer 71, a second conducting layer 72, and an insulating layer 73. The insulating layer 73 is located on the first conducting layer 71, and the second conducting layer 72 is located on the insulating layer 73. The insulating layer 73 is provided with a receiving space 732, and the second conducting layer 72 is provided with an opening 723. The LED structure of the second embodiment is mounted on the power supply boar 7 in the receiving space 732 via the opening 723, and is then turned relative to the opening 723, so that the main body 5 of the LED structure of the second embodiment is held in the receiving space 732 below the opening 723. At this position, the first conductive body 1 is in electric contact with the first conducting layer 71, the second conductive body 2 is in electric contact with the second conducting layer 72, and the light hood 6 is upward protruded from the opening 723. A conducting spring leaf 711 is provided on the first conducting layer 71 in the receiving space 732, such that when the main body 5 is received in the receiving space 732 below the opening 723, the conducting spring leaf 711 is located between the first conductive body 1 and the first conducting layer 71 to ensure firm disposition of the LED structure of the second embodiment in the receiving space 732.

Figure 18:
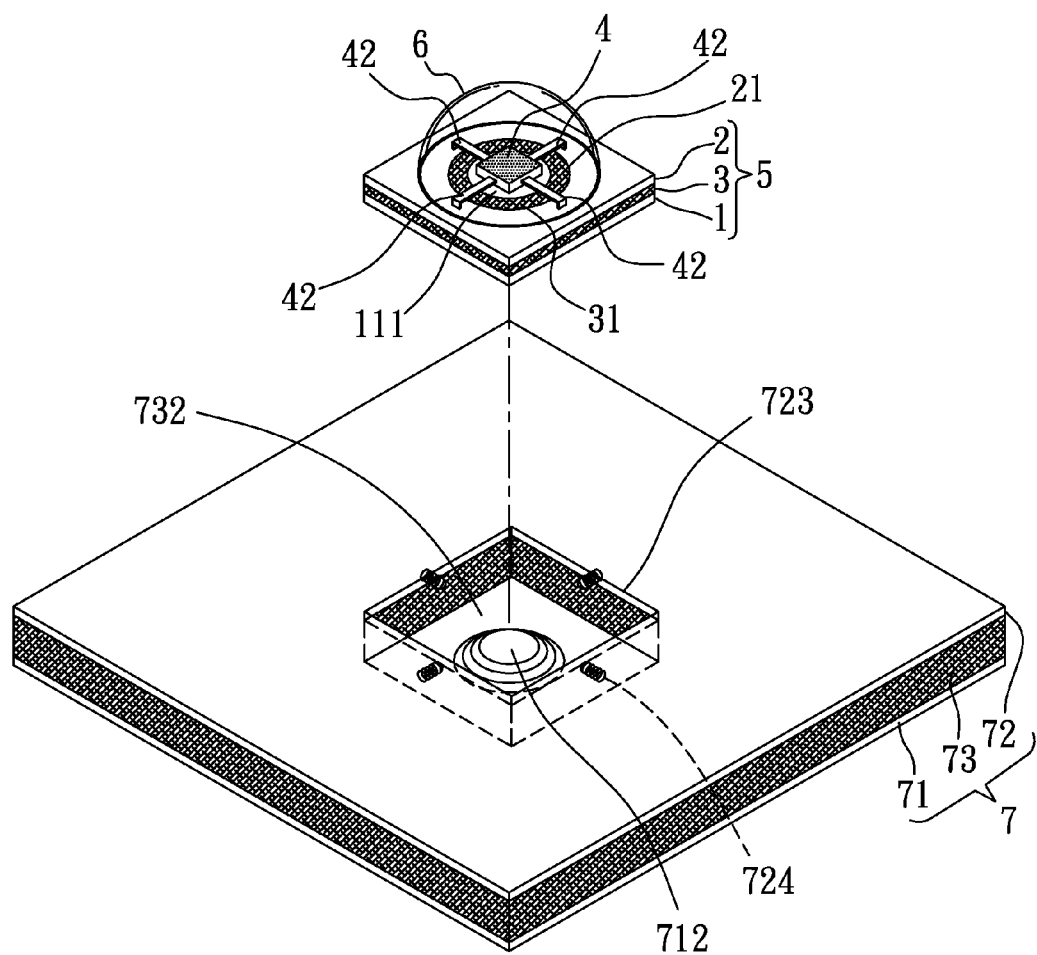
FIG. 18 is an exploded view of an LED structure according to a ninth preferred embodiment of the present invention.
Figure 19:
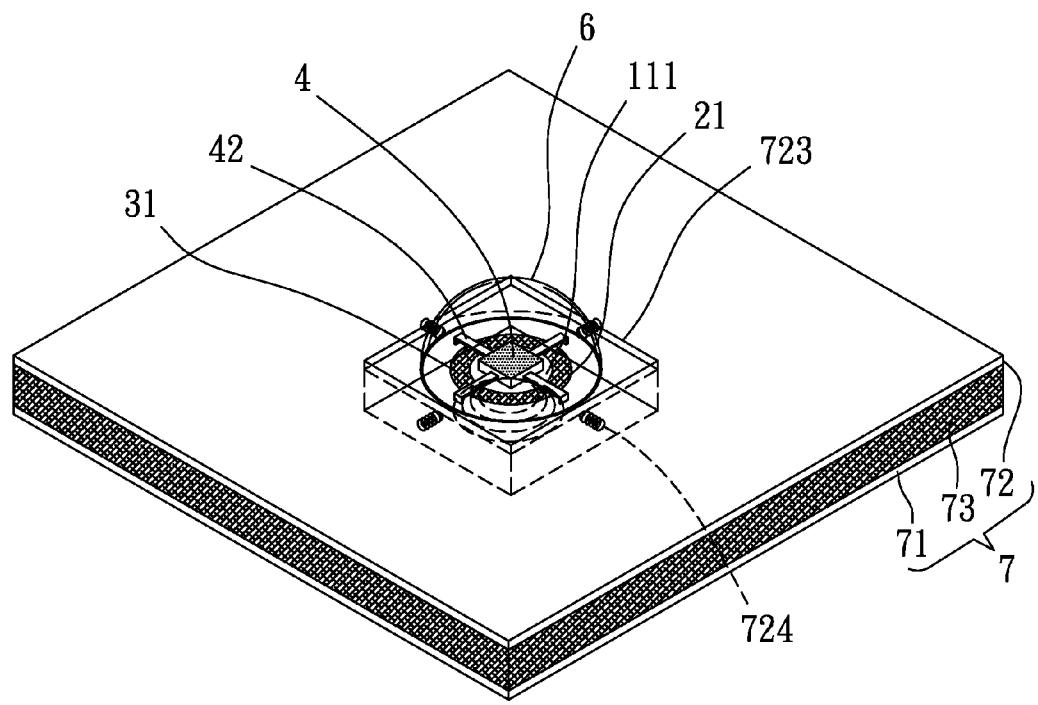
FIG. 19 is an assembled view of FIG. 18.
Figure 20:
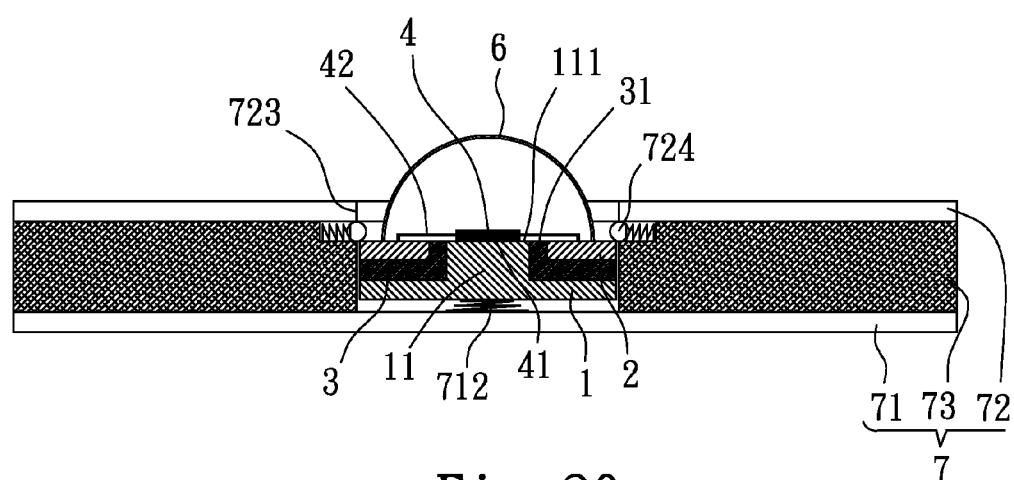
FIG. 20 is a vertical sectional view of FIG. 19.

FIGS. 18 to 20 are exploded perspective view, assembled perspective view, and assembled vertical sectional view, respectively, of an LED structure according to a ninth embodiment of the present invention. As shown, the LED structure of the ninth embodiment is a combination of the LED structure of the second embodiment and a power supply board 7. The power supply board 7 includes a first conducting layer 71, a second conducting layer 72, and an insulating layer 73. The insulating layer 73 is located on the first conducting layer 71, and the second conducting layer 72 is located on the insulating layer 73. The insulating layer 73 is provided with a receiving space 732, and the second conducting layer 72 is provided with an opening 723. A plurality of elastically retractable conducting terminals 724 is provided along the opening 723 to normally project from an inner rim of the opening 723. The LED structure of the second embodiment is mounted on the power supply boar 7 in the receiving space 732 via the opening 723. When the main body 5 of the LED structure of the second embodiment is downward moved through the opening 723, the conducting terminals 724 are elastically pushed backward by the main body 5. And, when the main body 5 has been moved through the opening 723 into the receiving space 732, the conducting terminals 724 are elastically restored to the projected position to electrically contact with the second conductive body 2 and hold the main body 5 in the receiving space 732 below the opening 723. At this position, the first conductive body 1 is in electric contact with the first conducting layer 71, and the light hood 6 is upward protruded from the opening 723. A conducting spring leaf 711 is provided on the first conducting layer 71 in the receiving space 732, such that when the main body 5 is received in the receiving space 732 below the opening 723, the conducting spring leaf 711 is located between the first conductive body 1 and the first conducting layer 71 to ensure firm disposition of the LED structure of the second embodiment in the receiving space 732.

Figure 21:
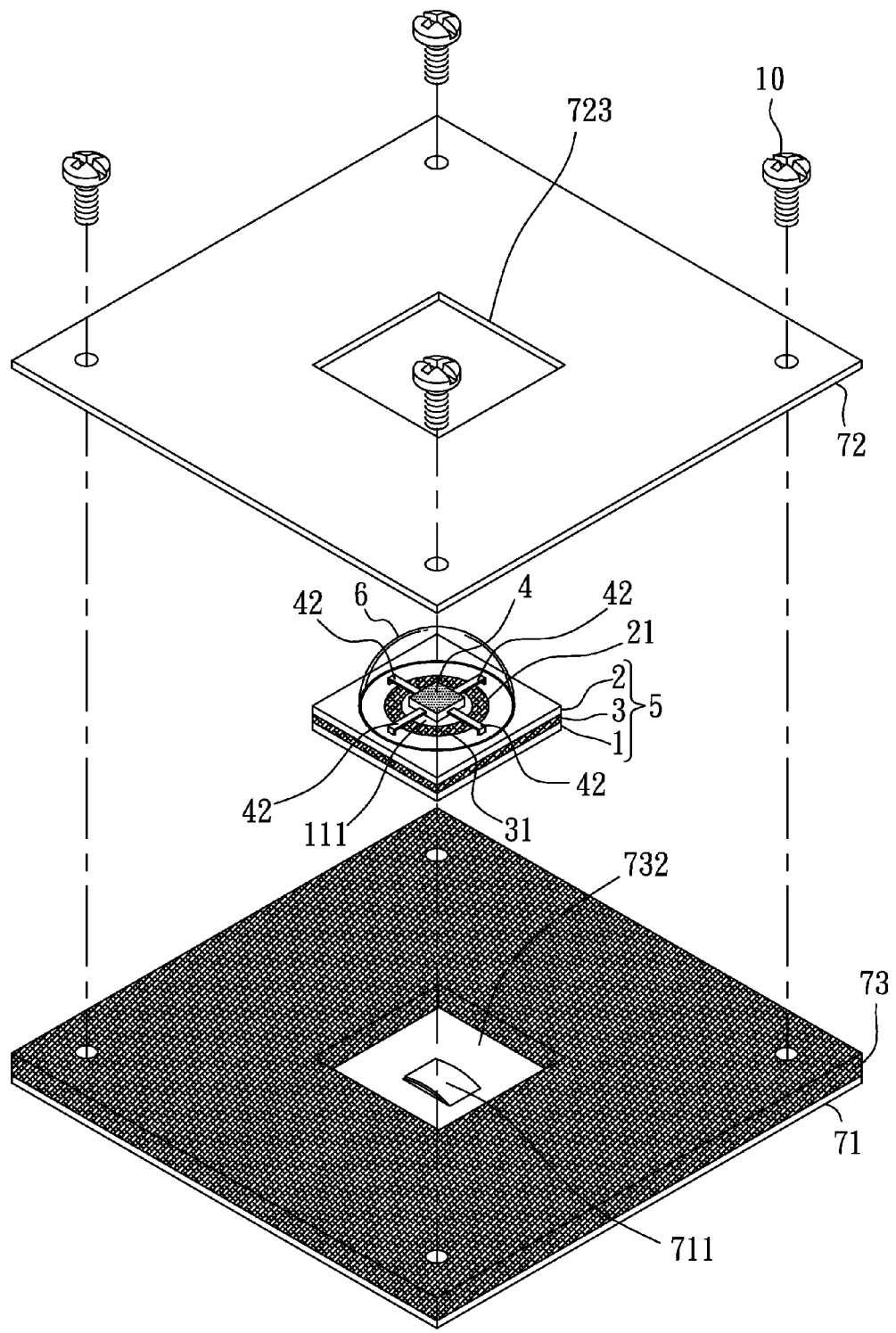
FIG. 21 is an exploded view of an LED structure according to a tenth preferred embodiment of the present invention.
Figure 22:
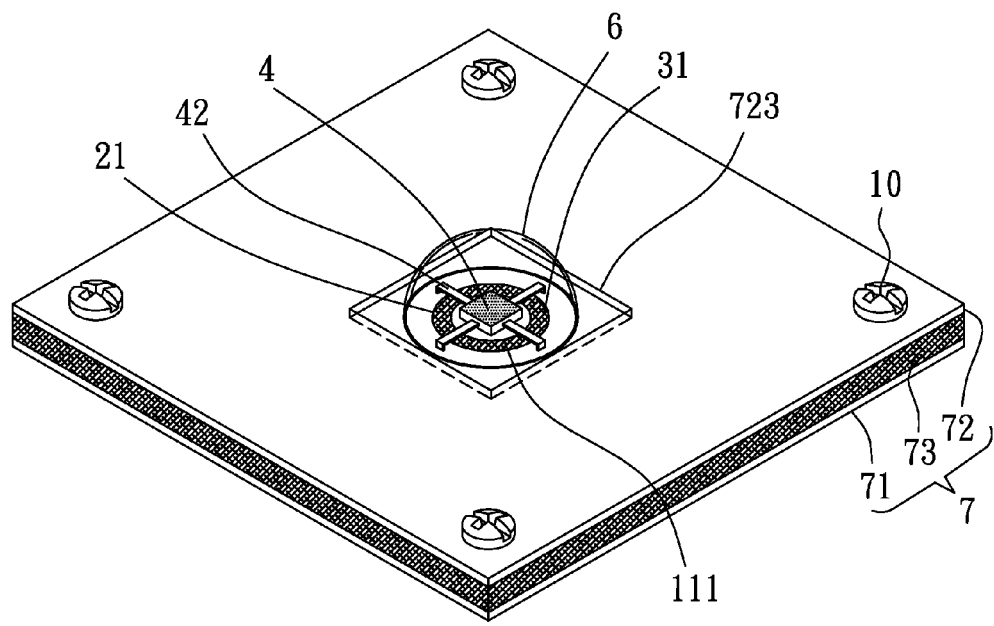
FIG. 22 is an assembled view of FIG. 21.
Figure 23:
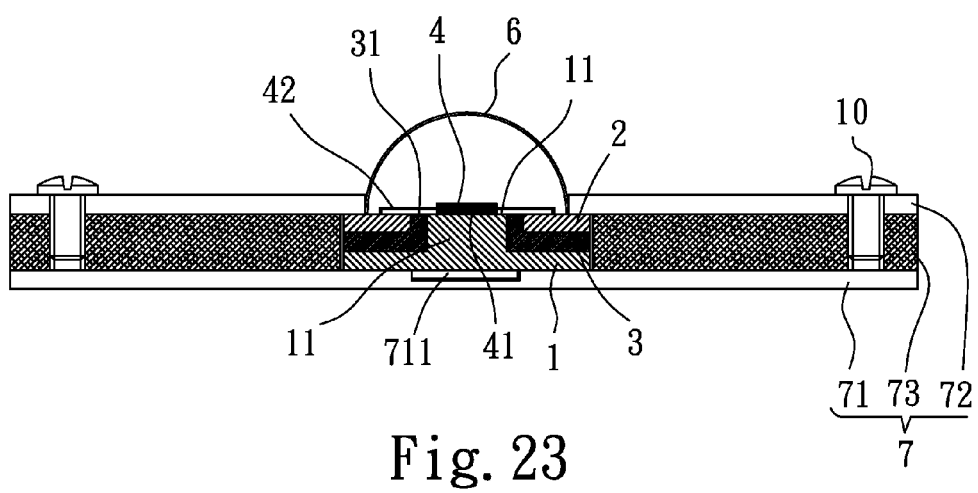
FIG. 23 is a vertical sectional view of FIG. 22.

FIGS. 21 to 23 are exploded perspective view, assembled perspective view, and assembled vertical sectional view, respectively, of an LED structure according to a tenth embodiment of the present invention. As shown, the LED structure of the tenth embodiment is a combination of the LED structure of the second embodiment and a power supply board 7. The power supply board 7 includes a first conducting layer 71, a second conducting layer 72, and an insulating layer 73. The insulating layer 73 is located on the first conducting layer 71, and the second conducting layer 72 is located on the insulating layer 73. The insulating layer 73 is provided with a receiving space 732, and the second conducting layer 72 is provided with an opening 723. The LED structure of the second embodiment is mounted on the power supply boar 7 in the receiving space 732 with the first conductive body 1 in electric contact with the first conducting layer 71. Then, the second conductive body 2 is fastened to a top of the insulating layer 73 using a plurality of screws 10, allowing the light hood 6 to upward protrude from the opening 723, and the second conductive body 2 to electric contact with the second conducting layer 72. A conducting spring leaf 711 is provided on the first conducting layer 71 in the receiving space 732, such that when the main body 5 is received in the receiving space 732 below the opening 723, the conducting spring leaf 711 is located between the first conductive body 1 and the first conducting layer 71 to ensure firm disposition of the LED structure of the second embodiment in the receiving space 732.

In the above embodiments of the present invention, the first electrodes 41, 44, the conducting section 111 on the first conductive body 1, and the first conducting layer 71 have the same polarity, which may be positive or negative. And, the second electrodes 42, the second conductive body 2, and the second conducting layer 72 have the same polarity, which is different from the polarity of the first electrodes, the conducting section, and the first conducting layer, and may be negative or positive.

The LED structure of the present invention can be mounted to the power supply board without the need of distinguishing the polarities of electrodes. A user needs only to dispose the LED structure in the receiving space formed on the power supply board and cause the LED structure to be held in the receiving space. Therefore, the LED structure of the present invention is easy to mount to and dismount from the power supply board, and can be conveniently replaced when necessary.

In the LED structure of the present invention, the second conductive body, the insulating body, and the first conductive body are sequentially stacked from top to bottom with the conducting portion of the first conductive body upward extended through the insulating body and the second conductive body to expose the conducting section at the sleeve portion, so that the LED may be mounted on the top of the conducting section of the first conductive body and electrically connected to the second conductive body. With these arrangements, the LED structure of the present invention could be very easily mounted to and dismounted from a power supply board, and accordingly, be conveniently replaced when necessary. Therefore, the present invention is novel, improved, and industrially valuable for use.

What is claimed is:

1. A light-emitting diode (LED) structure, comprising an LED assembly formed from:
    a first conductive body having an upward projected conducting portion;
    a first insulating body having an insulating sleeve portion and being disposed on the first conductive body with the insulating sleeve portion fitted around the conducting portion, such that a conducting section at a top of the conducting portion is exposed at the insulating sleeve portion;
    a second conductive body having a through opening, and being disposed on the first insulating body with the insulating sleeve portion of the first insulating body upward protruded into the through opening, such that the second conductive body is electrically isolated from the first conductive body by the first insulating body while; and
    an LED being mounted on the conducting section of the first conductive body, and including at least one first electrode electrically connected to the conducting section and at least one second electrode electrically connected to the second conductive body.

2. The LED structure as claimed in claim 1, wherein the first electrode is located at a lower side of the LED to electrically connect to the conducting section, and the second electrode is located at four sides of the LED to electrically connect to the second conductive body.

3. The LED structure as claimed in claim 1, wherein the LED assembly further includes a second insulating body located between the LED and the conducting section, and wherein the first electrode and the second electrode are located at four sides of the LED to electrically connect to the conducting section and the second conductive body, respectively.

4. The LED structure as claimed in claim 1, wherein the LED assembly further includes a light hood covering the LED, the first electrode, and the second electrode therein.

5. The LED structure as claimed in claim 4, wherein the light hood has a shape selected from the group consisting of a semispherical shape and a rectangular shape.

6. The LED structure as claimed in claim 4, further comprising a power supply board having a first conducting layer, a second conducting, an insulating layer, and an upper conductive cover plate; the insulating layer being located on the first conducting layer, and the second conducting layer being located on the insulating layer; the upper conductive cover plate being provided with a through opening, the second conducting layer being provided with an upper opening, and the insulating layer being provided with a receiving space; the LED assembly with the light hood being mounted in the receiving space via the upper opening, such that the first conductive body is in electric contact with the first conducting layer; and the upper conductive cover plate being fastened to the upper opening to thereby electrically contact with the second conductive body with the light hood upward protruded from the through opening of the upper conductive cover plate.

7. The LED structure as claimed in claim 4, further comprising a power supply board having a first conducting layer, a second conducting, an insulating layer, and a lower conductive cover plate; the insulating layer being located on the first conducting layer, and the second conducting layer being located on the insulating layer; the first conducting layer being provided with a lower opening, the second conducting layer being provided with a through opening, and the insulating layer being provided with a receiving space; the LED assembly with the light hood being mounted in the receiving space via the lower opening, such that the light hood is upward protruded from the through opening of the second conducting layer, and the second conductive body is in electric contact with the second conducting layer; and the lower conductive cover plate being fastened to the lower opening to thereby electrically contact with the first conductive body.

8. The LED structure as claimed in claim 4, further comprising a power supply board having a first conducting layer, a second conducting, and an insulating layer; the insulating layer being located on the first conducting layer, and the second conducting layer being located on the insulating layer; the insulating layer being provided with a receiving space, and the second conducting layer being provided with a first opening and two second openings, the second openings having a width smaller than that of the first opening and being located at two opposite ends of the first opening to communicate with the first opening; the LED assembly with the light hood being mounted in the receiving space via the first opening and then moved into one of the two second openings, such that the LED assembly is held in the receiving space below the second opening with the first conductive body in electric contact with the first conducting layer, the second conductive body in electric contact with the second conducting layer, and the light hood upward protruded from the second opening.

9. The LED structure as claimed in claim 8, wherein the first conducting layer is provided thereon with a conducting spring leaf, such that the conducting spring leaf is located between the first conductive body and the first conducting layer.

10. The LED structure as claimed in claim 4, further comprising a power supply board having a first conducting layer, a second conducting, and an insulating layer; the insulating layer being located on the first conducting layer, and the second conducting layer being located on the insulating layer; the insulating layer being provided with a receiving space and the second conducting layer being provided with an opening; the LED assembly with the light hood being mounted in the receiving space via the opening and then turned relative to the opening, such that the LED assembly is received in and held to the receiving space below the opening with the first conductive body in electric contact with the first conducting layer, the second conductive body in electric contact with the second conducting layer, and the light hood upward protruded from the opening of second conducting layer.

11. The LED structure as claimed in claim 10, wherein the first conducting layer is provided thereon with a conducting spring leaf, such that the conducting spring leaf is located between the first conductive body and the first conducting layer.

12. The LED structure as claimed in claim 4, further comprising a power supply board having a first conducting layer, a second conducting, an insulating layer, and a plurality of elastically retractable conducting terminals; the insulating layer being located on the first conducting layer, and the second conducting layer being located on the insulating layer; the insulating layer being provided with a receiving space and the second conducting layer being provided with an opening, and the plurality of elastically retractable conducting terminals being provided along the opening to normally project from an inner rim of the opening; and the LED assembly with the light hood being mounted in the receiving space via the opening; wherein when the LED assembly is moved through the opening, the conducting terminals are elastically pushed backward by the LED assembly, and when the LED assembly has been moved through the opening into the receiving space, the conducting terminals are elastically restored to the projected position to electrically contact with the second conductive body and hold the LED assembly in the receiving space below the opening, allowing the first conductive body to electrically contact with the first conducting layer and the light hood to upward protrude from the opening.

13. The LED structure as claimed in claim 12, wherein the first conducting layer is provided thereon with a conducting spring leaf, such that the conducting spring leaf is located between the first conductive body and the first conducting layer.

14. The LED structure as claimed in claim 4, further comprising a power supply board having a first conducting layer, a second conducting, an insulating layer; the insulating layer being located on the first conducting layer and having a receiving space provided thereon, and the second conducting layer being provided with an opening; the LED assembly with the light hood being mounted in the receiving space with the first conductive body in electric contact with the first conducting layer; and the second conducting layer being fastened to a top of the insulating layer to hold the LED assembly in the receiving space with the light hood upward protruded from the opening and the second conductive body in electric contact with the second conducting layer.

15. The LED structure as claimed in claim 14, wherein the first conducting layer is provided thereon with a conducting spring leaf, such that the conducting spring leaf is located between the first conductive body and the first conducting layer.

* * * * *